United States Patent
Chuang

(10) Patent No.: US 10,136,526 B2
(45) Date of Patent: Nov. 20, 2018

(54) ELECTRONIC DEVICE HAVING AN ELASTIC MEMBER

(71) Applicant: FOXCONN INTERCONNECT TECHNOLOGY LIMITED, Grand Cayman (KY)

(72) Inventor: Shun-Jung Chuang, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 94 days.

(21) Appl. No.: 15/209,702

(22) Filed: Jul. 13, 2016

(65) Prior Publication Data

US 2017/0020013 A1    Jan. 19, 2017

(30) Foreign Application Priority Data

Jul. 13, 2015   (TW) .............................. 104122583 A

(51) Int. Cl.
*H05K 5/02*    (2006.01)
*H05K 5/00*    (2006.01)

(52) U.S. Cl.
CPC ................................ *H05K 5/0021* (2013.01)

(58) Field of Classification Search
CPC . H05K 5/0021; H05K 5/0204; H04M 1/0254; H04M 1/72575; G06F 1/1601; G06F 1/1637; G06F 1/181; G06F 1/26; G06F 11/3044; G06F 11/1658; G06F 2200/1631
USPC ................................................ 361/724–727
See application file for complete search history.

(56) References Cited

U.S. PATENT DOCUMENTS

| | | | | |
|---|---|---|---|---|
| 5,278,730 A | * | 1/1994 | Kikinis | G06F 1/1626 361/679.32 |
| 5,690,233 A | * | 11/1997 | Kaneko | B65D 73/02 206/713 |
| 5,758,776 A | * | 6/1998 | Slocum | H01L 21/67333 206/714 |
| 5,769,236 A | * | 6/1998 | Maruyama | H05K 13/0417 206/713 |
| 5,878,890 A | * | 3/1999 | Kaneko | B65D 73/02 206/714 |
| 6,141,211 A | * | 10/2000 | Strickler | G06F 1/184 361/679.31 |
| 6,754,074 B2 | * | 6/2004 | McClelland, II | H05K 7/1409 361/690 |
| 7,074,082 B2 | | 7/2006 | Kerlin et al. | |
| 7,999,645 B2 | | 8/2011 | Sarda | |

(Continued)

*Primary Examiner* — Hoa C Nguyen
*Assistant Examiner* — Christopher L Augustin
(74) *Attorney, Agent, or Firm* — Wei Te Chung; Ming Chieh Chang

(57) ABSTRACT

An electronic device includes a framework extending in a longitudinal direction and defining a number of receiving grooves, a number of modules detachably mounted to the receiving grooves of the framework, and a number of elastic members. Each receiving groove has a notch beside a side edge of the framework. Each elastic member includes a fixed portion attached to the module and a free-end portion mated with the notch of the framework. A gap communicating with the notch is defined between the module and the framework for accessing the free-end portion of the elastic member to elastically deform the free-end portion to separate from the notch.

10 Claims, 7 Drawing Sheets

(56) References Cited

U.S. PATENT DOCUMENTS

| | | | | |
|---|---|---|---|---|
| 8,508,930 B2* | 8/2013 | Peng | .................. | G06F 1/187 |
| | | | | 312/223.1 |
| 2002/0039676 A1* | 4/2002 | Ohashi | ................ | H01M 2/1044 |
| | | | | 429/96 |
| 2003/0112596 A1* | 6/2003 | Shih | .................. | G06F 1/184 |
| | | | | 361/679.33 |
| 2011/0096523 A1* | 4/2011 | Li | .................. | G06F 1/1626 |
| | | | | 361/807 |
| 2012/0293975 A1* | 11/2012 | Liang | .................. | G06F 1/188 |
| | | | | 361/807 |
| 2015/0263473 A1 | 9/2015 | Guo | | |
| 2015/0288422 A1* | 10/2015 | Fishman | .............. | H04B 5/0037 |
| | | | | 455/41.1 |

* cited by examiner

ELECTRONIC DEVICE HAVING AN ELASTIC MEMBER

BACKGROUND OF THE INVENTION

1. Field of the Invention

The present disclosure relates generally to an electronic device, and more particularly to an electronic device with a plurality of detachable modules.

2. Description of Related Arts

U.S. Patent Application Publication No. 20150288422 discloses a system for enabling a chassis-coupled modular mobile electronic device. The system includes a modular electronic device enablement system, a set of module couplers, and a chassis. The module couplers preferably couple modules mechanically to the chassis. The module couplers may have detents or structures that resist movement of the modules when they are fully coupled, including spring-loaded balls mounted on a surface of the module that fits into corresponding shallow holes on a complementary surface of the module coupler. The module coupler may also retain the module using a latching mechanism, e.g., a pin that when extended prevents the module from being removed (the pin would be retracted to remove the module), or a snap latch that holds the module tight against the contact surfaces of the module coupler when engaged. The module couplers preferably have mechanical guides or other guides to aid in aligning the module during coupling and in module retention through friction. The guides are preferably defined by a cavity with a geometric profile that is complementary to at least a portion of the profile of a module, e.g., the module couplers are profiled to retain soft-trapezoidally-shaped modules. The module couplers are preferably designed to contact a module of a soft trapezoidal shape on four surfaces, three sides of the module and the bottom of the module. The module coupler may additionally also retain the module with a retention mechanism, e.g., magnets placed on a far edge of the module coupler and a corresponding edge of an inserted module. The modules and the module couplers are preferably sized according to a grid system. The multiple modules may additionally or alternatively couple together with an adapter, e.g., a clip-on rib to allow them to fit securely in the module coupler. In a varied module coupler, electropermanent magnets (EPMs) may also be included.

An improved electronic device is desired to compensate for the defects in the previous technology.

SUMMARY OF THE INVENTION

Accordingly, an object of the present invention is to provide an electronic device having a plurality of detachable modules with a high retention force.

To achieve the above object, an electronic device comprises a framework extending in a longitudinal direction and defining a plurality of receiving grooves, a plurality of modules detachably mounted to the receiving grooves of the framework, and a plurality of elastic members. Each receiving groove has a notch beside a side edge of the framework. Each elastic member comprises a fixed portion attached to the module and a free-end portion mated with the notch of the framework. A gap communicating with the notch is defined between the module and the framework for accessing the free-end portion of the elastic member to elastically deform the free-end portion to separate from the notch.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Referring to FIGS. 1 to 7, an electronic device 100 comprises a framework 1, a number of modules 2 detachably mounted to the framework 1 and an elastic member 3 for assembling the modules 2 to the framework 1. The modules 2 are assembled to the framework 1 along a first transverse direction. The modules 2 are detached from the framework 1 along a second transverse direction opposite to the first transverse direction.

Figure 1:
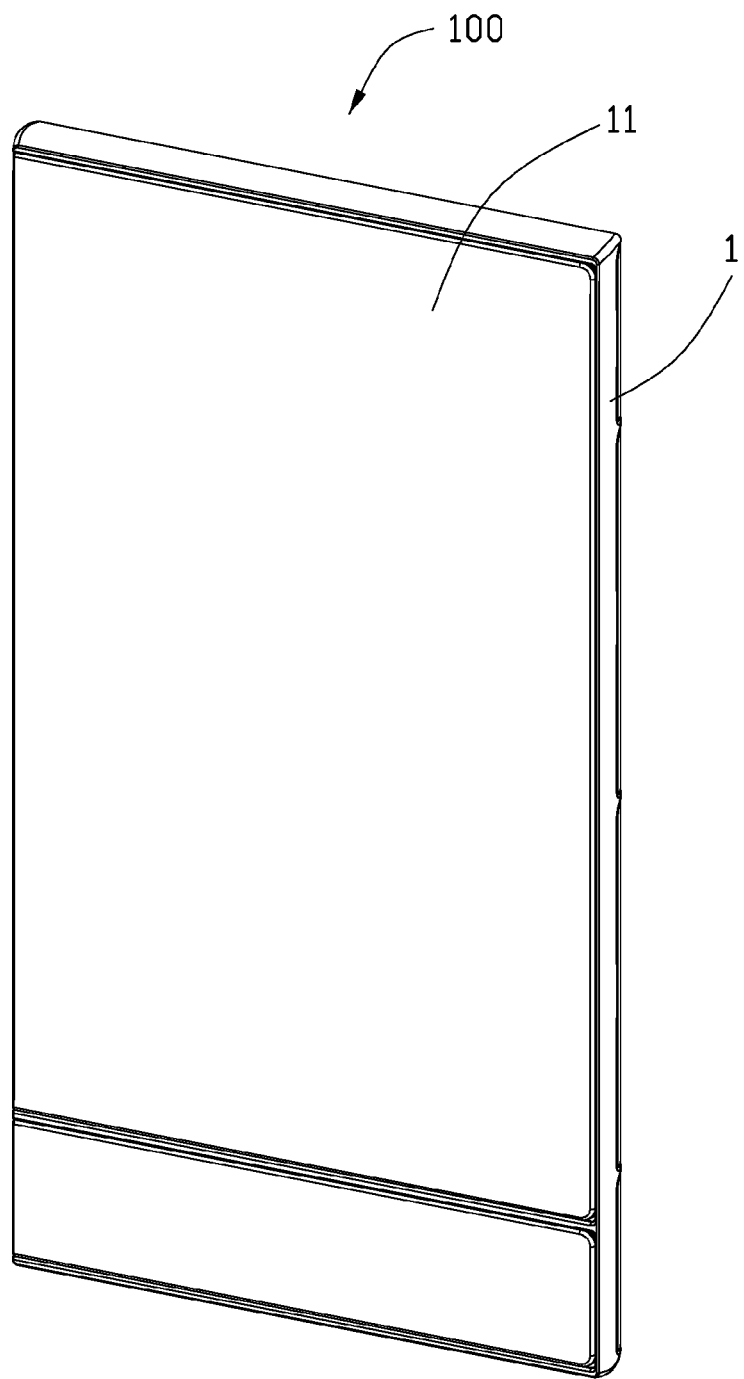
FIG. 1 is a perspective, assembled view of an electronic device of the present invention.
Figure 2:
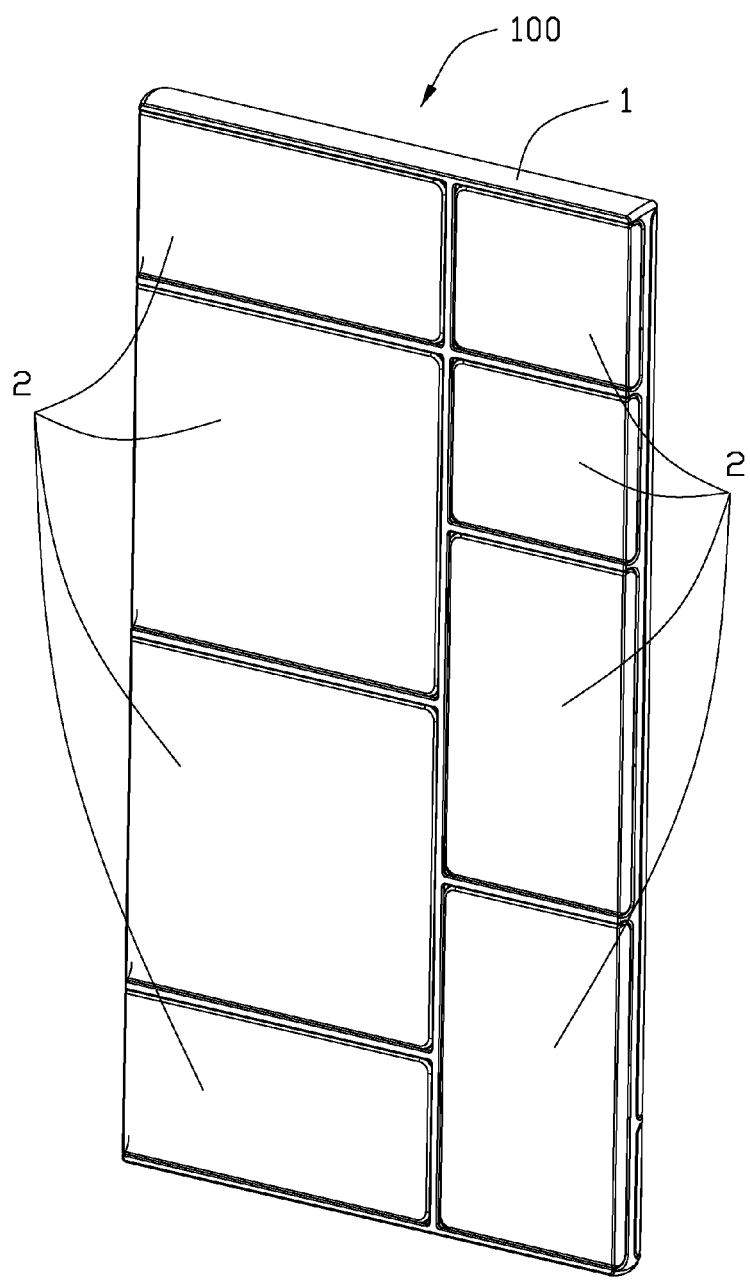
FIG. 2 is another perspective view of FIG. 1.
Figure 3:
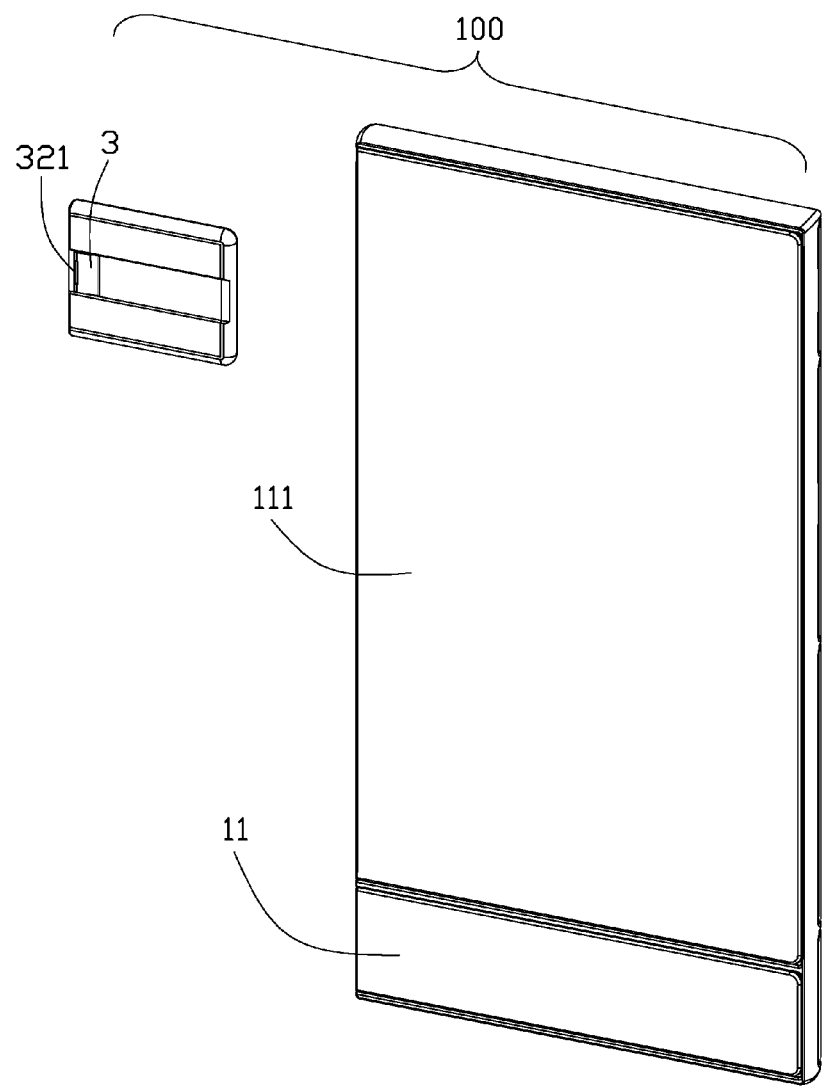
FIG. 3 is a perspective exploded view of the electronic device of the present invention.
Figure 4:
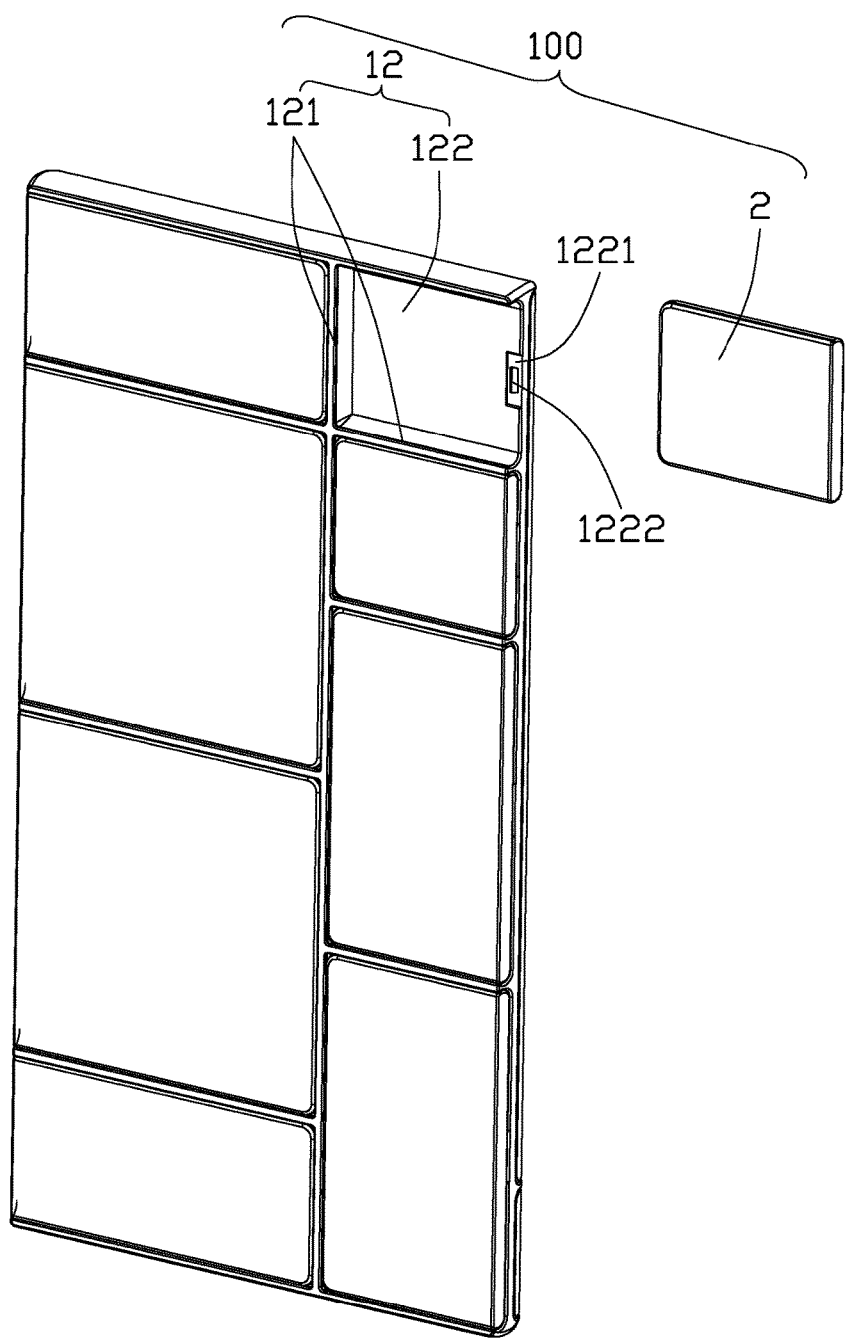
FIG. 4 is another perspective view of FIG. 3.

Referring to FIGS. 3 to 4, the framework 1 defines an upper surface 11 and a lower surface 12 positioned oppositely against the upper surface 11. The upper surface 11 includes a panel slot 111 reserved for the screen. The lower surface 12 includes a number of segmented ribs 121 separating the lower surface 12 into various receiving grooves 122 receiving different modules 2. Each receiving groove 122 has a notch 1221 beside a side edge of the framework 1 extending in a longitudinal direction and a tuber 1222 located at the notch 1222.

Referring to FIGS. 3 to 7, the modules 2 have different sizes. Each module 2 includes an insulative housing 21 and a shielding shell 22 enclosing the insulative housing 21 and forming a receiving room 20. Each module 2 further includes a depression 201 at an outer edge of the insulative housing 21, a pair of resisting portions 202 separated from each other at two sides of the depression 201 along the longitudinal direction, and a slit 203 formed between the resisting portions 202 and an inner surface of the depression 201. The depression 201 is used for receiving the elastic member 3. The shielding shell 22 includes an opening 222 corresponding with the depression 201 and a compressing surface 221 beside the opening 222. The length of the opening 222 is smaller than that of the depression 201 along the first transverse direction.

Referring to FIGS. 3 to 7, the elastic member 3 includes a main portion 33, a fixed portion 31 extending from one end of the main portion 33 and attached to the modules 2, and a free-end portion 32 extending from the other end of the main portion 33 and extending out of the receiving room 20. The fixed portion 31 is acted as stepped-shaped and includes a bending portion 311 bent upwardly from the main portion 33, a compressing portion 312 extending horizontally from the bending portion 311, and a locking portion 313 extending upwardly from the compressing portion 312. The locking portion 313 gets stuck in the slit 203. The compressing portion 312 is pressed by the compressing surface 221 making the main portion 33 and the free-end portion 32 exposed to the opening 222. The free-end portion 321 is mated with the notch 1221 and comprises a recess 321 mated with the tuber 1222. When the modules 2 are assembled to the framework 1 along the first transverse direction, the free-end portion 32 resists the notch 1221. A gap 23 is formed between the modules 2 and the framework 1. The gap 23 communicates with the notch 1221. When the modules 2 are broken or need to be replaced, the extraction tool 4 inserts into the gap 23 and resists the free-end portion 32 of the elastic member 3. The free-end portion 23 is elastically deformable and is separated from the notch 1221. The modules 2 are detached from the framework 1 along the second transverse direction.

Figure 5:
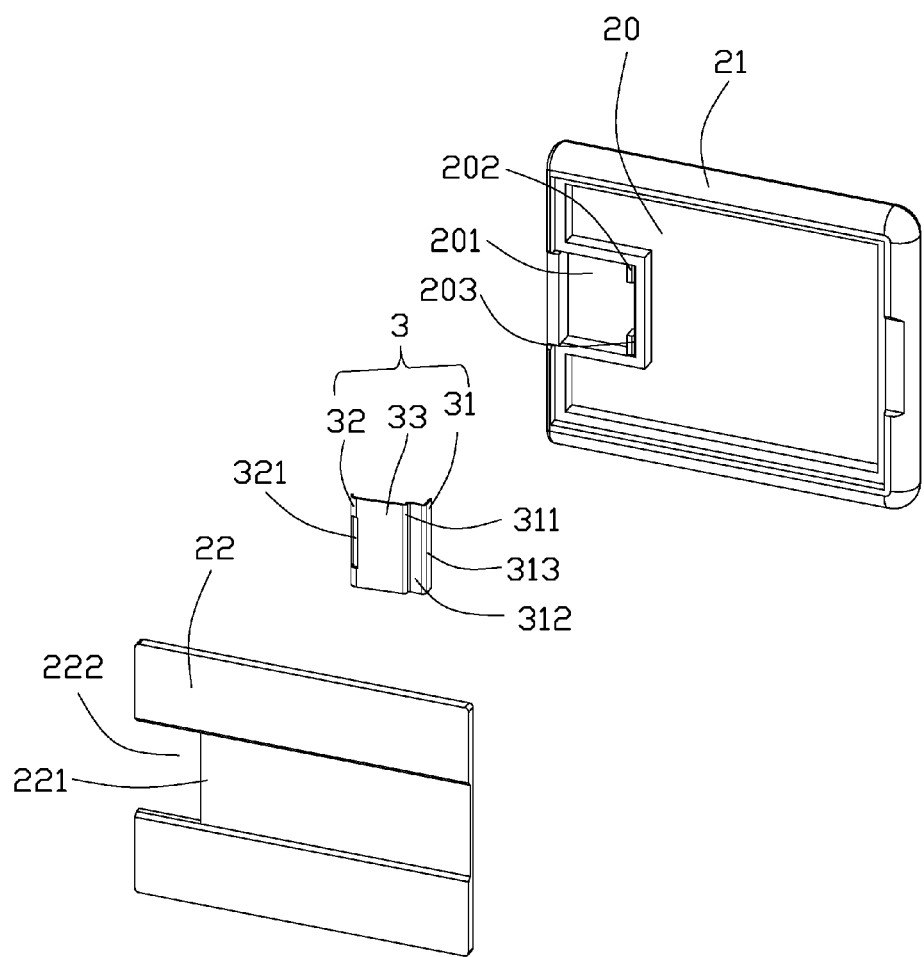
FIG. 5 is a perspective exploded view of the modules of the electronic device.
Figure 6:
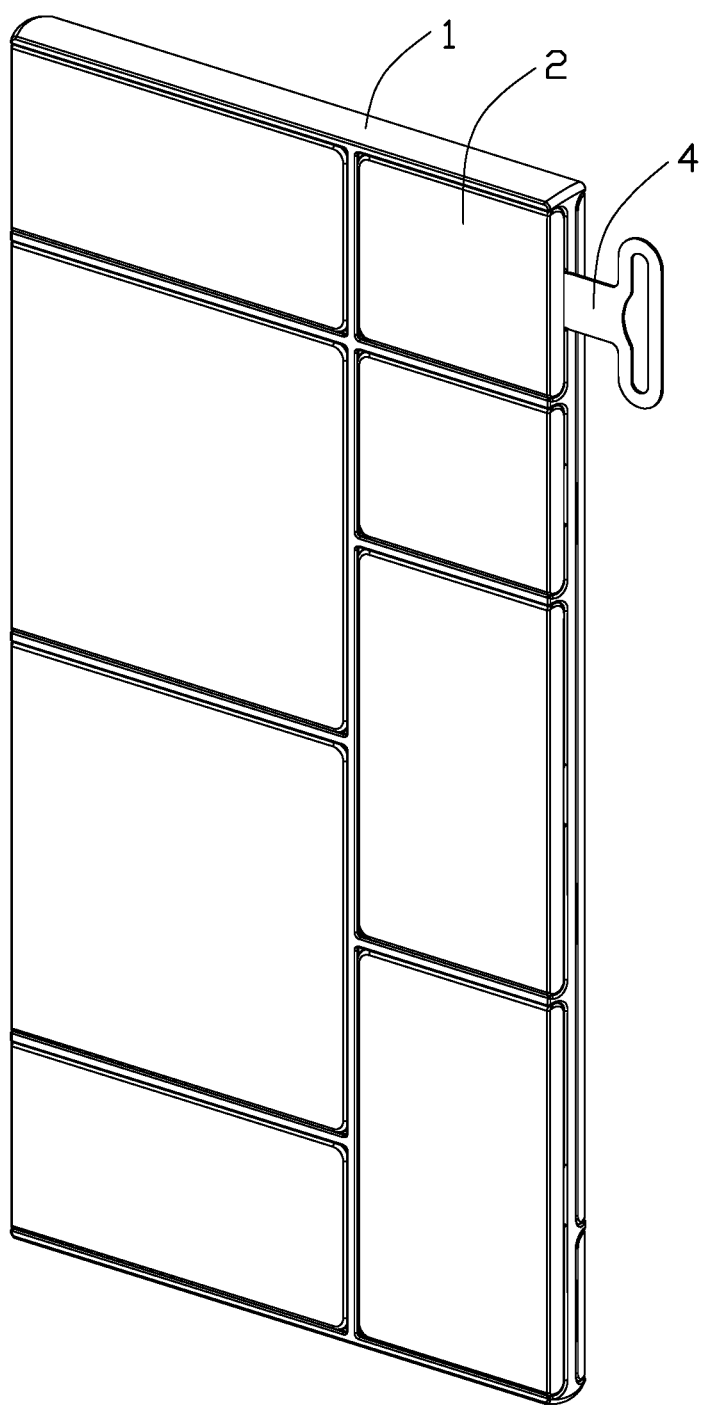
FIG. 6 is a perspective view of the modules separated by an extraction tool.
Figure 7:
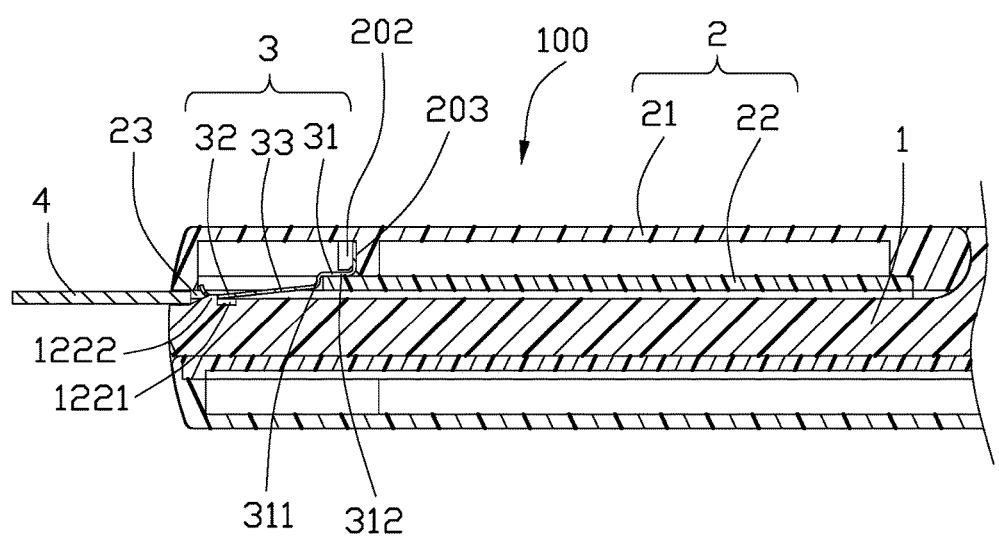
FIG. 7 is a cross-sectional view of the electronic device inserted by the extraction tool.

Referring to FIGS. 5 and 6, the modules 2 are assembled to/detached from the framework 1 at a plurality of longitudinal edges. The electronic device 100 includes two modules 2 assembled to the framework 1 respectively along the first transverse direction and the second transverse direction. The two modules 2 are detached from the framework 1 respectively along the second transverse direction and the first transverse direction. In other embodiments, the electronic device 100 includes one module 2 assembled to the framework 1 along the first transverse direction.

The electronic device 100 further includes an EPM (Electro Permanent Magnet) in the framework 1. The framework 1 and the module 2 preferably have complementary interface pads. The framework 1 preferably has an electro permanent magnet while the module 2 has a complementary magnetic attachment point. When the module 2 is slid into the framework 1, the ribs enable the module 2 to be guided into an attachment position, whereby the modules are detachably retained in the receiving grooves and the interface pads of the module 2 and the framework 1 interact. Then, the electro permanent magnet is activated to secure the module 2 in that position. Additionally or alternatively, the module 2 may have an electro permanent magnet while the framework 1 has a complementary magnetic attachment point.

When the electronic device demands need to be replaced, individual module 2 is able to be replaced with corresponding function. And when the modules 2 are detached from the framework 1, the retention force between the framework 1 and the modules 2 is to be overcome by the extraction tool 4. In this embodiment, the module 2 forms a bulged waist section of the side section in a vertical cross-section and the receiving groove 122 also forms a corresponding side section to comply with that of the module 2 so as to have the module 2 assembled into the corresponding receiving groove 122 along a horizontal direction from the side edge of the framework. This conformation may prevent the module from being dropped off from the framework 1 in the vertical direction.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. An electronic device comprising:
    a framework extending in a longitudinal direction and defining a plurality of receiving grooves, each receiving groove having a latching tuber around a side edge thereof;
    a plurality of modules detachably mounted within the receiving grooves of the framework; and
    a plurality of elastic members each comprising a fixed portion attached to the module and a moveable portion having a corresponding latching recess mated with the latching tuber; wherein
    the moveable portion of the elastic member is located inwardly of the side edge of the framework, and
    a gap is located around said side edge and defined between the module and the framework for accessing, from an exterior, the moveable portion of the elastic member by inserting an extraction tool in a horizontal direction perpendicular to the longitudinal direction to elastically deform the moveable portion to disengage the latching tuber from the latching recess.

2. The electronic device as claimed in claim 1, wherein each module forms a bugled side section in a vertical cross-section, and the corresponding receiving groove forms a corresponding bulged side edge in the vertical cross-section to compliantly receive said bulged side section for guidably assembling the module into the receiving groove along the horizontal direction without risks of being dropped off in a vertical direction perpendicular to said horizontal direction.

3. The electronic device as claimed in claim 2, wherein said moveable portion is deflectable in the vertical direction.

4. The electronic device as claimed in claim 3, wherein the framework exposes the module in the vertical direction.

5. The electronic device as claimed in claim 1, wherein a notch is formed in the receiving groove to surround the corresponding latching tuber, and the gap communicates with said notch for accessing the moveable portion from said exterior.

6. A method of assembling an electronic device comprising steps of:
    providing a framework with a plurality of receiving grooves each communicating with an exterior in both a vertical direction and a horizontal direction perpendicular to each other, each of said receiving grooves being equipped with a latching tuber around a side opening;
    horizontally assembling, along the horizontal direction, a plurality of modules into the corresponding receiving grooves via the corresponding side openings, respectively, each of said module being equipped with a moveable portion having a latching recess therein to latchably receive the corresponding latching tuber therein; wherein
    a gap is formed around the side opening between the corresponding module and the corresponding receiving groove so as to perform accessibility of the moveable portion for disengaging the latching recess from the latching tuber by deflecting the moveable portion in the vertical direction; wherein
    after assembled, the module is exposed to the exterior in both said vertical direction and said horizontal direction with regard to the framework.

7. An electronic device comprising:
    a framework defining an upper surface and a lower surface opposite to each other in a vertical direction, said upper surface forming a panel slot and said lower surface forming a plurality of receiving grooves, each of said receiving grooves including a notch around a side edge of the framework which extends in a longitudinal direction perpendicular to the vertical direction, and a tuber located in the notch;

a plurality of modules detachably mounted within the receiving grooves of the framework along a transverse direction perpendicular to both said vertical direction and said longitudinal direction; and a plurality of elastic members each comprising a fixed portion attached to the module and a moveable portion having a corresponding latching recess mated with the latching tuber; wherein a gap located around said side edge and defined between the module and the framework for accessing, from an exterior, the moveable portion of the elastic member to elastically deflect the moveable portion in said vertical direction to disengage the latching tuber from the latching recess.

8. The electronic device as claimed in claim 7, wherein each module forms a bugled side section in a vertical cross-section, and the corresponding receiving groove forms a corresponding bulged side edge in the vertical cross-section to compliantly receive said bulged side section for guidably assembling the module into the receiving groove along said transverse direction without risks of being dropped off in said vertical direction.

9. The electronic device as claimed in claim 8, wherein the framework exposes the module in the vertical direction.

10. The electronic device as claimed in claim 7, wherein the gap communicates with said notch for easy accessing the moveable portion from said exterior.

\* \* \* \* \*